United States Patent [19]

Ilardi et al.

[11] Patent Number: 5,041,943
[45] Date of Patent: Aug. 20, 1991

[54] HERMETICALLY SEALED PRINTED CIRCUIT BOARD

[75] Inventors: Joseph M. Ilardi, Sparta, N.J.; Bernard P. Gollomp, West Lawrence, N.Y.; Bruce E. Kurtz, Lebanon, N.J.

[73] Assignee: Allied-Signal Inc., Morris Township, Morris County, N.J.

[21] Appl. No.: 595,338

[22] Filed: Oct. 10, 1990

Related U.S. Application Data

[63] Continuation-in-part of Ser. No. 432,248, Nov. 6, 1989.

[51] Int. Cl.⁵ .............................................. H05K 7/20
[52] U.S. Cl. .................................. 361/386; 174/50.51; 357/81; 361/388
[58] Field of Search .................... 174/50.5, 50.51, 52.3; 357/74, 81; 361/386-389, 401, 402, 414

[56] References Cited

U.S. PATENT DOCUMENTS

| 3,777,221 | 12/1973 | Tatusko et al. | 317/101 CP |
|---|---|---|---|
| 3,795,975 | 3/1974 | Calhoun et al. | 29/574 |
| 3,918,148 | 11/1975 | Magdo et al. | 29/576 |
| 4,197,633 | 4/1980 | Lorenze, Jr. et al. | 29/577 R |
| 4,554,229 | 11/1985 | Small, Jr. | 430/17 |
| 4,630,172 | 12/1986 | Stenerson et al. | 361/386 |
| 4,640,010 | 2/1987 | Brown | 29/832 |
| 4,773,955 | 9/1988 | Mabuchi et al. | 361/386 |

Primary Examiner—Gregory D. Thompson
Attorney, Agent, or Firm—Donald B. Paschburg; Howard G. Massung; Robert A. Walsh

[57] ABSTRACT

The invention relates to an improvement in dielectric type printed circuit boards having wells for mounting active circuit components on a metal substrate for heat dissipation. The improvement resides in a hermetic seal for the printed circuit board which includes a lid hermetically sealed to the top surface of the circuit board, as well as a chemically vapor deposited coating on the dielectric around the active components to prevent seepage of water and oxyen through the lid edges and into the well regions which would otherwise be detrimental to the active components.

8 Claims, 1 Drawing Sheet

HERMETICALLY SEALED PRINTED CIRCUIT BOARD

CROSS-REFERENCE TO RELATED APPLICATION

This application is a Continuation-In-Part of commonly assigned co-pending U.S. application Ser. No. 432,248 filed by J. M. Ilardi, et al on Nov. 6, 1989, and is related to commonly assigned co-pending U.S. application Ser. No. 319,439, likewise filed by J. M. Ilardi, et al on Mar. 6, 1989.

BACKGROUND OF THE INVENTION

This invention relates generally to an improvement in printed circuit boards which are fabricated from, for example, a polyimide dielectric material. More particularly, this invention relates to an improvement in the invention disclosed in the aforenoted U.S. application Ser. No. 319,439, and which disclosure is incorporated herein by reference.

Prior to the invention of U.S. application Ser. No. 319,439, heat generated by electronic and electrical components was dissipated by employing at least one or, more usually, a combination of conduction, radiation and convection techniques. The aforenoted patent application teaches improved high resolution circuit density, copper/polyimide type, multilayer, surface mount, printed circuit boards, and further discloses a modification in the process of U.S. application Ser. No. 2,545, filed on Jan. 12, 1987 (now abandoned), and which disclosure is also incorporated herein by reference.

In the prior art, a metal substrate is provided to produce a high circuit density printed circuit board supported by the metal substrate which is capable of dissipating large amounts of heat. The printed circuit board is generally fabricated by applying a first layer of radiation curable dielectric material to the substrate. A photomask is thereafter disposed to define the conductor circuit patterns adjacent the surface of the radiation curable dielectric material. The material is exposed to a source of radiation and developed to expose those regions of the substrate where a first conductor circuit pattern is to be formed, as by photoimaging. Thereafter, the conductor circuit pattern is formed on the surface of the substrate by plating a metal coating onto those regions of the substrate covered by the exposed layer of the first layer of the curable dielectric material to provide a printed circuit board of which the first layer of the dielectric material is a structural component. The details of manufacturing circuit boards in accordance therewith is well disclosed in the aforenoted U.S. application Ser. No. 319,439 and is disclosed herein only to the extent required for purposes of describing the present invention.

In accordance with the aforenoted U.S. application Ser. No. 319,439, a polyimide dielectric material is processed so that wells for active components such as integrated circuits (ICs) are provided as the circuit pattern is being laid down through the disclosed process. Further, coaxial leads are buried in the polyimide dielectric to connect to ICs mounted in the wells.

SUMMARY OF THE INVENTION

In accordance with the present invention, there is provided an improvement in photoimaged dielectric circuit boards of the type having active components mounted in wells on a metal substrate for heat dissipation. More particularly, the improvement is in a circuit board fabricated of exposed dielectric material on a heat conducting substrate with wells in the dielectric material extending to the substrate, and with active circuit components mounted in the wells for heat dissipation which are electrically interconnected through coaxial leads buried throughout the dielectric material to complete a circuit. Still more particularly, the improvement resides in that the active circuit components and the buried coaxial leads are protected from the ambient environment by a hermetic seal.

More specifically, the hermetic seal includes a cover or lid sealed to the top of the circuit board to protect the active components. The coaxial leads buried in the dielectric material extend out the top surface thereof for establishing a circuit with said components. Still more specifically, the hermetic seal includes a coating on the dielectric material, at least in and around the wells, which is impervious to water and/or oxygen, to prevent migration thereof from the exterior through the dielectric material and into the lid sealed region and into contact with the active circuit devices. Preferably, the coating is a chemically vapor deposited layer of silicon nitride which is a ceramic-like coating. The lid is preferably sealed to the board by means of, for example, a solder preform and the circuit devices are preferably fixedly mounted to the substrate in the wells by means also of soldered preforms.

The substrate itself, which should be impervious to water to maintain hermeticity, is preferably a laminated metal plate for dissipating heat from the active circuit components mounted thereon.

DETAILED DESCRIPTION OF THE INVENTION

Figure 1:
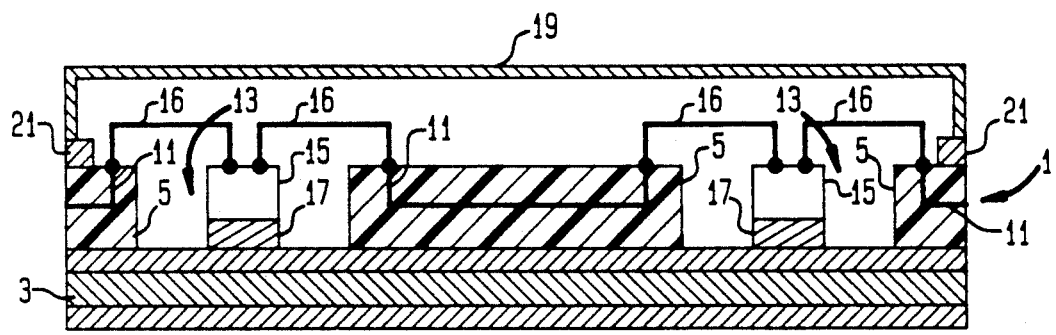
FIG. 1 is a sectioned side view showing a circuit board configured in accordance with the invention.

FIG. 1 shows a printed circuit board 1 which includes a substrate 3, preferably a laminated metal substrate for heat dissipation purposes. As can be seen, built up on substrate 3 is a dielectric layer 5 which includes coaxial leads 11 buried therein. The dielectric, after having been exposed in accordance with a predetermined masking pattern also includes wells 13 in which are mounted active circuit components 15, for example, integrated circuits (ICs) which are preferably tape automated or otherwise bonded as at 16 to the buried coaxial leads 11. As noted previously, the processing for establishing or building up these circuit boards is well known from the aforenoted U.S. application Ser. No. 319,439. The details of this processing will not be discussed further herein, with reference being made to that application as well as to the aforementioned U.S. application Ser. No. 2,545.

In accordance with the present invention, a hermetic sealed cover 19 is provided which is preferably, for example, of a non-oxidizable metal. Cover 19 is typically sealed to the top of dielectric 5 which is a polyimide material by means of conventional solder preforms 21 or other like sealing means. Likewise, components 15 are secured within wells 13 also by means of conventional solder preforms 17 or other like thermally conductive sealing means.

Although cover 19 provides an impervious seal to water and/or oxygen, it is noted that polyimide dielectric 5, is typically not impervious to water and thus, seepage can occur from the edges of the cover through the polyimide, for example, and into the region containing components 15.

Figure 2:
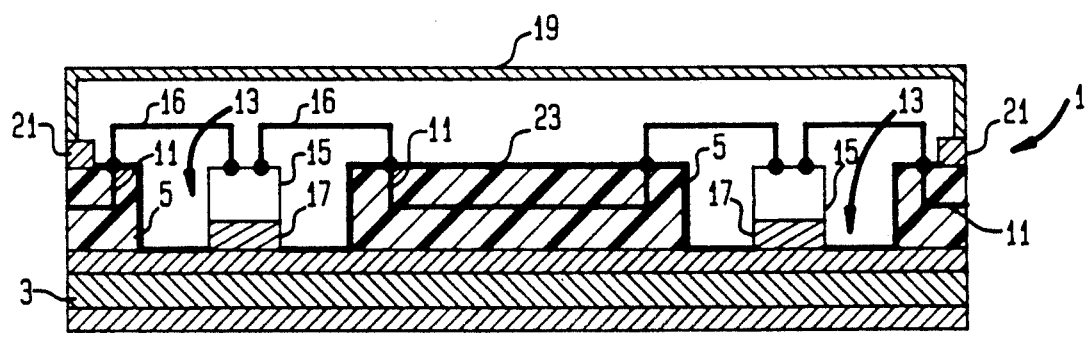
FIG. 2 is a sectioned side view showing a circuit board, and best showing the hermetically sealed features thereof in accordance with the invention.

In order to avoid the problem of water and/or oxygen seepage and hence circumvention of the seal provided by cover 19, a layer or coating of material 23 impervious to water and/or oxygen is provided on the polyimide surface 5 around the wells, and to ensure a complete seal, preferably over the entire circuit board and extending into the wells to seal with the surface of the substrate 3 as best shown in FIG. 2, wherein corresponding elements illustrated in FIG. 1 carry corresponding numerical designations. The coating is preferably deposited by a chemical vapor deposition process and is preferably of silicon nitride which is a ceramic-like coating for the purposes intended.

In regard to the hermetic seal as herein described, it will be understood that the chemically vapor deposited layer of silicon nitride ensures the desired hermeticity. Components 15 are completely surrounded by a continuous metal/silicon nitride barrier, both of which are impervious to moisture and oxygen. Coaxial leads 11 extend through the dielectric material 5 and through coating 23 so as to be connected to components 15. This is in contrast to other sealing arrangements such as referred to in U.S. Pat. No. 4,630,172 issued on Dec. 16, 1986 to Stenerson, et al. The Stenerson patent refers to "glop sealing" wherein a suitable compound is used to seal, i.e. (pot) the circuit board, wire bonds, contacts, components, etc. Such a sealing arrangement suffers particular disadvantages such as, for example, impeding component replacement or wire and contact repair, the same being obviated by the present invention. Further, a seal of the type taught by Stenerson does not necessarily provide a moisture impervious seal and, indeed, may itself promote the migration of moisture as will be recognized as disadvantageous.

Moreover, since components 15 are directly mounted on substrate 3 via solder preforms 17, many of the problems associated with, for example, the component being mounted within a ceramic package as in the prior art to provide a hermetic seal, are no longer of concern, i.e. repairability of the ceramic package, as is often required.

With the above description of the invention in mind, reference is made to the claims appended hereto for a definition of the scope of the invention.

What is claimed is:

1. A circuit board comprising:
   a laminated metal substrate designed for dissipating heat;
   a dielectric material disposed on the substrate and having wells therein extending to the substrate;
   circuit components mounted in the wells;
   coaxial leads buried in the dielectric material extending therefrom so as to be electrically connected to the circuit components mounted in the wells;
   a cover hermetically sealed to the dielectric material so as to extend over the material and over the components mounted in the wells;
   a hermetically sealing coating disposed on the surface of the dielectric material and extending in and around the wells and around the components therein, with the buried coaxial leads extending through the hermetically sealing coating; and
   the hermetically sealed cover and the hermetically sealing coating cooperating to prevent deterioration of the circuit components due to ambient environmental conditions.

2. A circuit board as described by claim 1, including:
   solder preform means for securing the cover to the dielectric material whereby the cover is hermetically sealed to the dielectric material.

3. A circuit board as described by claim 1, including:
   solder preform means mounting the circuit components in the wells in the dielectric material and on the laminated metal substrate.

4. A circuit board as described by claim 1, wherein:
   the hermetically sealing coating is a chemically vapor deposited coating.

5. A circuit board as described by claim 4, wherein:
   the chemically vapor deposited hermetically sealing coating is a ceramic-like coating.

6. A circuit board as described by claim 5, wherein:
   the ceramic-like coating is a coating of silicon nitride.

7. A circuit board as described by claim 1, wherein:
   the laminated metal substrate is impervious to deteriorating environmental conditions to maintain the hermeticity provided by the cover and the hermetically sealing coating.

8. A circuit board as described by claim 1, wherein:
   the hermetically sealed cover and the hermetically sealing coating cooperate to prevent deterioration of the circuit components due to ambient environmental conditions in that the coating prevents seepage of deteriorating environmental elements from the edges of the cover through the dielectric material, which is non-impervious to the elements, to the circuit components.

* * * * *